United States Patent
Ciesla et al.

(10) Patent No.: US 9,244,484 B2
(45) Date of Patent: Jan. 26, 2016

(54) FRACTIONAL-N SPREAD SPECTRUM STATE MACHINE

(71) Applicant: International Business Machines Corporation, Armonk, NY (US)

(72) Inventors: Anthony E. Ciesla, Poughkeepsie, NY (US); Paul D. Muench, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 231 days.

(21) Appl. No.: 14/103,288

(22) Filed: Dec. 11, 2013

(65) Prior Publication Data
US 2015/0160687 A1  Jun. 11, 2015

(51) Int. Cl.
*G06F 1/08* (2006.01)
*H03L 7/08* (2006.01)

(52) U.S. Cl.
CPC ... *G06F 1/08* (2013.01); *H03L 7/08* (2013.01)

(58) Field of Classification Search
CPC .................................. G06F 1/08; H03L 7/08
See application file for complete search history.

(56) References Cited

U.S. PATENT DOCUMENTS

| | | | |
|---|---|---|---|
| 7,437,590 B2 | 10/2008 | Decker et al. | |
| 7,590,163 B1 * | 9/2009 | Miller | H03B 23/00 375/130 |
| 7,676,012 B1 | 3/2010 | Venugopal et al. | |
| 7,737,791 B2 | 6/2010 | Sareen et al. | |
| 8,866,519 B1 * | 10/2014 | Hiebert | H03L 7/08 327/147 |
| 2005/0242851 A1 | 11/2005 | Booth et al. | |
| 2008/0215907 A1 | 9/2008 | Wilson | |
| 2008/0303566 A1 | 12/2008 | Shen et al. | |
| 2011/0057693 A1 | 3/2011 | Huang | |
| 2011/0095830 A1 | 4/2011 | Tsangaropoulos et al. | |
| 2011/0188551 A1 | 8/2011 | Shin et al. | |
| 2012/0327974 A1 | 12/2012 | Kim et al. | |

OTHER PUBLICATIONS

Data Sheet AD9577; "Clock Generator with Duall PLLs, Spread Spectrum, and Margining"; Analog Devices; p. 1-44; 2011.

* cited by examiner

*Primary Examiner* — Albert Wang
(74) *Attorney, Agent, or Firm* — Cantor Colburn LLP; William A. Kinnaman, Jr.

(57) ABSTRACT

Embodiments of the present invention may be realized in a fractional-N spread spectrum clock (SSC) generator utilizing an SSC state machine generating a single clock gating signal to drive a fractional-N phase locked loop (PLL) frequency multiplier to generate an SSC output clock. The SSC generator leverages upon the development of the digital PLL to implement the SSC generator within the final core PLL. The SSC generator only requires a relatively low base frequency reference clock and digital programming including an SSC rate and a modulation definition signal to produce the fractional-N spread spectrum output clock. The SSC generator results in cost savings through a high frequency SSC output clock generator that utilizes a relatively slow reference clock without the need for multiple high frequency clocks or multiple feedback clocks to drive the PLL.

20 Claims, 6 Drawing Sheets

FRACTIONAL-N SPREAD SPECTRUM STATE MACHINE

BACKGROUND

The present invention relates to computer system clocks and, more particularly, relates to a fractional-N phase locked loop (PLL) computer clock driven by a spread spectrum clock (SSC) gating signal to reduce electromagnetic interference.

Computer clocks are a known source of electromagnetic interference (EMI), which is a disturbance that adversely affects electrical circuits. This disruption can limit and degrade the performance of these circuits. Spread spectrum clocking is a technique in which a particular clock frequency is spread in the frequency domain to correspondingly spread out the EMI over a wider bandwidth to reduce the concentration of the interference. Systems for reducing EMI using various SSC approaches have been practiced for generations. Historically, these approaches required multiple high frequency clock generators operating at the desired range of output frequencies, which are combined in some fashion to create the SSC clock signal.

Phase Locked Loop (PLL) frequency multiplier chips have been developed for generating high frequency computer clocks from lower frequency reference clocks. This approach utilizes a crystal oscillator to generate a relatively slow base frequency known as the reference clock. The reference clock is then fed into the PLL, which multiplies the frequency to generate an output clock that is anywhere from one to one hundred times the base reference clock. The PLL multiplication rate may typically be varied using a feedback control signal, for example over a range of ±1% around the base multiplication rate, to provide an SSC characteristic to the output clock. The spread spectrum output clock produced by the PLL is then utilized as the final SSC output clock for the design. With this approach, varying the PLL multiplication rate to spread the output clock spectrum typically requires multiple feedback clocks operating at desired range of output frequencies. The various feedback clocks are combined in some manner to create the feedback signal to drive the PLL multiplication rate to produce the variable frequency SSC output clock. Generating and combining multiple high frequency feedback clocks to create the SSC gating signal requires complex circuitry and control techniques that become impractical as the desired output frequency increases.

SUMMARY

According to one embodiment of the present invention, a fractional-N spread spectrum clock (SSC) generator for a computer system includes a fractional-N phase locked loop (PLL) frequency multiplier and a spread spectrum clock state machine. The PLL receives a reference clock signal as an input and applies a variable multiplication factor to the reference clock signal to producing an output clock signal having a variable output frequency. The SSC state machine produces a single clock gating signal fed into the PLL that controls the multiplication factor of the PLL to vary the output clock signal of the PLL. The multiplication factor is set to a nominal value N and the single clock gating signal defines a modulation waveform that drives the variable multiplication factor to cause the PLL the generate a fractional-N, spread spectrum output clock signal defined by digital programming input to the SSC state machine. The digital programming input to the SSC state machine includes a modulation definition signal and an SSC rate signal.

Additional features and advantages are realized through the techniques of the present invention. Other embodiments and aspects of the invention are described in detail herein and are considered a part of the claimed invention. For a better understanding of the invention with the advantages and the features, refer to the description and to the drawings accompanying figures.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of the present invention may be realized in a fractional-N spread spectrum clock (SSC) generator utilizing an SSC state machine generating a single clock gating signal to drive a fractional-N phase locked loop (PLL) frequency multiplier to generate an SSC output clock. The previous implementations of spread spectrum clocks utilizing digital circuits involved the generation of multiple high frequency clocks or multiple feedback clocks requiring complex circuitry to combine the feedback clocks into a PLL control signal. Combining multiple feedback clocks in the feedback control scheme complicates the design and is not feasible to maintain multiple high speed clocks in higher frequency applications.

The SSC generator enabled by the present disclosure leverages upon the development of the digital PLL to implement the SSC generator within the final core PLL. The SSC generator only requires a relatively low base frequency reference clock and digital programming including an SSC rate and a modulation definition signal to produce the fractional-N, spread spectrum output clock. The SSC generator results in cost savings through a high frequency SSC output clock generator that utilizes a relatively slow reference clock without the need for multiple high frequency clocks or a combination of multiple feedback clocks to drive the PLL.

Embodiments of the invention provide improved SSC generators that utilize only one clock gating signal generated by an SSC state machine in the PLL feedback control scheme to provide a cost effective spread spectrum clock generator for higher frequency applications. Utilizing a digital state machine to dither the PLL multiplier bits at a predetermined rate provides an SSC generator that is not dependent on any particular output frequency or multiple high speed clocks. Driving a fractional-N digital PLL with the digital SSC state machine provides the capability of generating general purpose spread spectrum clocks suitable for a wide range of applications.

With reference now to the figures, a fractional-N, SSC generator including a PLL frequency multiplier controlled by a digital state machine is shown and described. A specific numerical example including one particular set of frequency and timing parameters are included on the figures to provide one particular illustrative example to aid in the description. It will be understood that the specific numerical example is one particular embodiment that is illustrative of a wide range of possible operating parameters. This example is in no way limiting, but is included merely to provide a specific numerical example to aid in the description.

Figure 1:
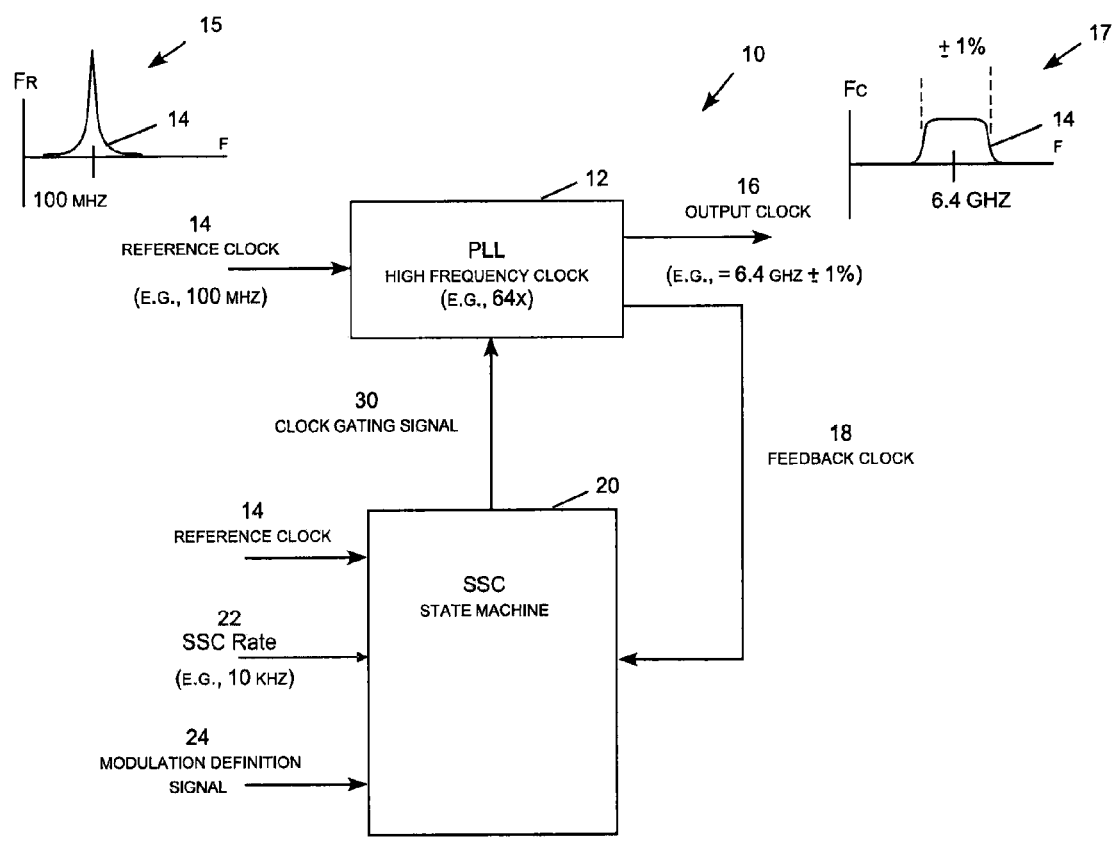
FIG. 1 is a high-level conceptual block diagram of a fractional-N spread spectrum clock (SSC) generator utilizing an SSC state machine generating a single clock gating signal to drive a fractional-N phase locked loop (PLL) frequency multiplier to generate an SSC output clock according to an embodiment of the invention.

FIG. 1 is a high-level conceptual block diagram of a fractional-N SSC generator 10 that includes a fractional-N PLL 12 controlled by a digital SSC state machine 20, which generates a single clock gating signal 30 to drive the PLL to generate an SSC output clock 16. The PLL 12 receives a relatively low frequency reference clock 14, which it multiplies by a variable multiplication factor to create a variable frequency output signal 16. As shown in the conceptual frequency graph 15, the reference clock 14 is concentrated in a narrow band around the base frequency (100 MHz in the illustrative numerical example). The PLL 12 multiplies the reference clock by the multiplication factor (nominally 64× in the illustrative numerical example) to produce a high frequency output clock 16 (nominally 6.4 GHz in the numerical example). A feedback clock 18 at the output frequency (nominally 6.4 GHz in the numerical example) provides a feedback control signal for controlling the multiplication factor to adjust the output frequency.

In a standard PLL clock, the feedback clock 18 would be fed through a divider to down-convert the feedback clock to the reference clock rate. In the numerical example, for instance, the standard feedback divider set to 1/64 would lock the PLL multiplier at 64 to lock the output signal at 6.4 GHz. In addition, a standard PLL would only be capable of implementing multiplication factors that are whole integer multiples of the reference clock. Thus, the multiplication rate of a standard PLL could be adjusted from the 64× shown in the numerical example to a range of other integer multiples (e.g., 63×, 62×, 61×, etc.) The multiplication factor is adjusted by changing the sampling rate of the feedback divider. In the numerical example, changing the divider rate to 1/63 would increase the PLL multiplier by one integer value, changing the divider rate to 1/62 would increase the PLL multiplier by an additional integer value, and so forth. Similarly, changing the divider rate to 1/65 would decrease the PLL multiplier by one integer value, changing the divider rate to 1/66 would decrease the PLL multiplier by an additional integer value, and so forth. While this provides some range of potential output frequencies, the options are limited to the relatively few integers multiples available.

A "fractional-N" PLL, on the other hand, allows for sub-integer (fractional-N) PLL multipliers. In general, patterns of integer-multiple multiplication factors are combined over sufficiently long periods, referred to as the "step rate" (or the "SSC rate" for the illustrative embodiments) to impart an effective sub-integer multiplier over the entire step. To provide one particular numerical illustration, the PLL multiplier may be alternated between 63 and 64 during a step to produce an effective multiplier of 63.5 over the entire step. Similarly, the multiplier may be modulated in many different patterns to impart an effective sub-integer multipliers down to small fractions of integer multiple (e.g., three instances of 63 and one instance of 64 produces an effective multiplier of 63.25; nine instances of 63 and one instance of 64 produce an effective multiplier of 63.10, ninety-nine instances of 63 and one instance of 64 produce an effective multiplier of 63.01, and so forth). So long as the step rate set for changing the output frequency is sufficiently low compared to the feedback clock rate (for example a step rate in KHz range for the 6.4 GHz nominal feedback clock rate in the illustrated example), thousands of feedback clock pulses will be included for each step in the output clock allowing for effective fractional PLL multipliers down to the MHz range.

In the SSC generator 10, the feedback control signal 18 is fed to the SSC state machine 20, which utilizes the feedback clock to generate a single modulated clock gating signal 30. The clock gating signal, in turn, is supplied to the PLL 12 to variably drive the multiplier rate of the PLL 12 on a fractional-N basis to impart an SSC characteristic to the output clock, as described above. In the numerical example, the nominal PLL multiplier is set to 64 (corresponding to a nominal output frequency of 6.4 GHz) and the SSC state machine 20 varies the clock gating signal 30 to drive the PLL multiplier to 64±1%, which in turn drives the output clock 16 to exhibit an output frequency of 6.4 GHZ±1%. The resulting SSC output clock 16 is shown conceptually in the frequency domain in the graph 17. It should be appreciated that the SSC state machine 20 drives the PLL 12 to produce the fractional-N, SSC output clock 16 utilizing only the single feedback clock 18 obtained directly from the PLL, along with the reference clock 14 provided as an input to the PLL, and settings programmed into the SSC state machine 20. As a result, the single clock gating signal 30 is created digitally using the reference and feedback clocks already available in a standard fractional-N PLL without the need to generate additional high speed clocks or combine multiple clocks to create the clock gating signal.

To provide a specific example, the SSC state machine generates the clock gating signal 30 utilizing the reference clock 14 (100 MHz in the numerical example), the feedback clock 18 (nominally 6.4 GHz in the numerical example), an SSC rate 22 (reflecting a modulation "step rate" producing a 10 KHz modulation cycle), and a digital modulation definition signal 24 that defines a specific output frequency modulation waveform driven by the clock gating signal 30. In this particular embodiment, the output frequency modulation pattern is a stair-step pattern that varied through digital programming of the SSC state machine. A "multiplier high" portion of the modulation pattern (controlling output frequencies above the nominal) may be controlled separately from a "multiplier low" portion of the modulation pattern (controlling output frequencies below the nominal) to allow for upper, center and down spread clocks. The numeral example shown in the frequency graph 17 is centered (i.e., 6.4 GHz±1%), whereas the frequency response for an for an upper spread clocks with the same spread range would be to the positive side (i.e., 6.4 GHz+2%), and the frequency response for an for a lower spread clocks with the same spread range would be to the negative side (i.e., 6.4 GHZ−2%). The SSC state machine 20 can be turned on and off, the modulation definition signal 24 defining the steps of the modulation pattern can be changed, and the SSC rate 22 defining the period of the modulation pattern can be changed through digital programming of the SSC state machine.

Figure 2:
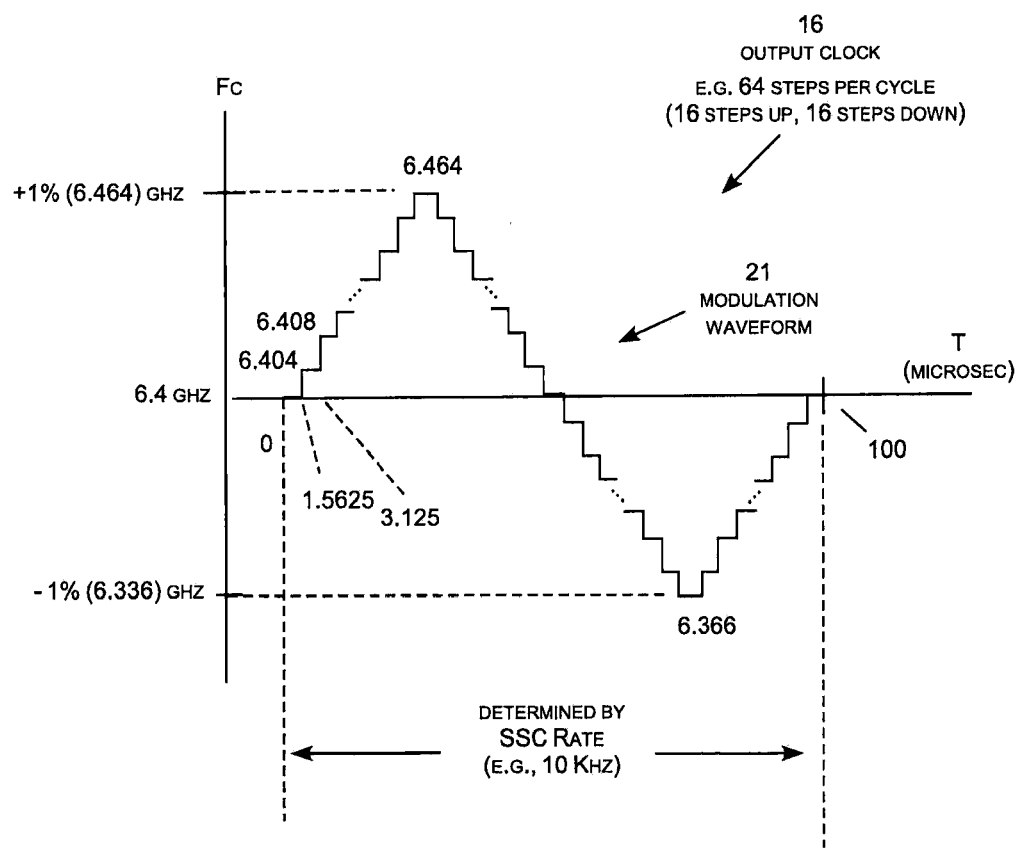
FIG. 2 is a conceptual illustration of an illustrative SSC output clock generated by the SSC generator according to an embodiment of the invention.

FIG. 2 is a conceptual illustration of an illustrative SSC output clock 16 generated by the SSC generator 10 according to an embodiment of the invention. While the frequency graph 17 shown on FIG. 1 conceptually illustrates the SSC output clock 16 in the frequency domain, FIG. 2 conceptually illustrates this waveform in the time domain. As noted above, the SSC state machine 20 can generate a variety of programmable stair-step modulation patterns. To provide an illustrative numerical example, the modulation definition signal 24 is set to generate a stair-step pattern with 16 steps up from nominal (6.4 GHz in this example) and 16 steps down from nominal for a total of 64 steps per modulation cycle. The SSC rate 22 is set to cycle the modulation pattern at 10 KHz, which equates to a modulation cycle having a period of 100 microseconds divided into 64 steps. The corresponding SSC rate 22 is therefore set to 1.5625 microseconds per step in this example (i.e., 100 microseconds per modulation cycle divided by 64 steps).

The rising section of the upper portion of the modulation waveform 21 rises 64 MHz (i.e., 1% of 6.4 GHz) over 16 steps, resulting in 4 MHz or 0.004 GHz per step. Since the nominal output frequency is set to 6.4 GHz for this example, the modulation pattern rises in 16 steps with increments of 0.04 GHz (i.e. the output frequencies for the steps are 6.400 GHz for the first step, 6.404 GHz for the second step, 6.408 GHz for the third step, and so forth up to 6.464 GHz). The falling section of the upper portion of the modulation waveform 21 correspondingly declines in 16 steps back to the nominal output frequency of 6.4 GHz. A similar lower portion of the modulation waveform 21 is determined by "multiplier low" settings of the modulation definition signal 24 of the SSC state machine 20. Each step has a duration of 1.5625 microseconds in this particular example, which is set by the SSC rate 22. The number and size of the steps is therefore determined by the modulation definition signal 24 of the SSC state machine 20, while the step duration is set by the SSC rate 22.

Figure 3:
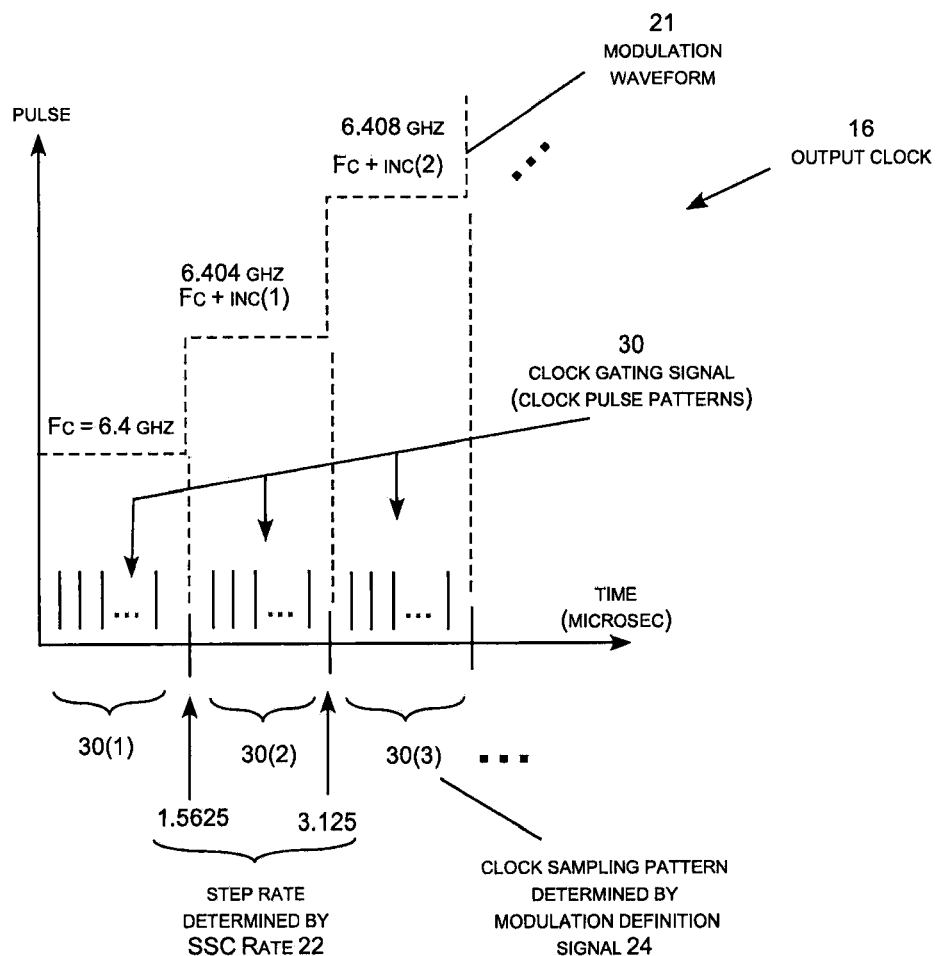
FIG. 3 is a conceptual illustration of a clock gating signal generated by the SSC state machine according to an embodiment of the invention.

FIG. 3 is a conceptual illustration of the clock gating signal 30 generated by the SSC state machine 20. The clock gating signal 30 consists of clock pulses used to gate, and thereby control the multiplier, of the PLL 12. The pattern of clock pulses is set for each step of the modulation waveform 21 to drive the PLL 12 to generate the desired output frequencies for each step. Although the effective output frequency is effectively constant for each step, the sampling rate of the feedback clock 18 typically cycles through a pattern selected to generate the desired fractional-N effective frequency for the step as described previously. For the example shown in FIG. 3, the clock gating signal 30(1) during the first step may reflect a first fractional-N pattern of sampling rates applied to the feedback clock 18 resulting in the desired output frequency for the first step (6.400 GHz in the specific numerical shown); the clock gating signal 30(2) during the second step may reflect a second fractional-N pattern of sampling rates applied to the feedback clock 18 resulting in the desired output frequency for the second step (6.404 GHZ in the specific numerical shown); the clock gating signal 30(3) during the third step may reflect a third fractional-N pattern of sampling rates applied to the feedback clock 18 resulting in the desired output frequency for the first step (6.408 GHz in the specific numerical shown), and so forth.

It should be noted that for the illustrative numerical example, the nominal frequency of the feedback clock 16 is 6.4 GHz while the frequency of the modulation waveform 21 is 10 KHz, which provides on the order of 640,000 feedback clock pulses for each modulation waveform cycle, which translates to about 10,000 feedback clock pulses per step. This is more than sufficient to define the appropriate sampling rate patterns for each step to drive the PLL 12 to generate the MHz-range fractional-N steps desired for the spread spectrum technique. By adding the SSC state machine 20 in front of the fractional-N divider of the fractional-N PLL 12, the multiplication rate of the PLL can be manipulated to generate the desired spread spectrum output clock 16 exhibiting a ±1% spread (±64 MHz) around the nominal output frequency (6.4 GHz). This allows for a stair-step modulation waveform having MHz-range fractional-N steps, an example of which is shown in FIG. 3.

The modulation definition signal 24 can be adjusted to create an upward (by controlling only a "multiplier high" input signal), center (by controlling both the "multiplier high" input signal and the "multiplier low" input signal), or downward spread clock (by controlling only the "multiplier low" input signal). The state machine 20 does not limit the operating frequency of the PLL 12, and can easily be turned on or off. The size of the spread, the number of steps, and the frequency of the modulation waveform can all be readily adjusted through digital programming of the SSC state machine 20. In this particular design, variations of the stair-step waveform are the only modulation waveforms available.

Figure 4:
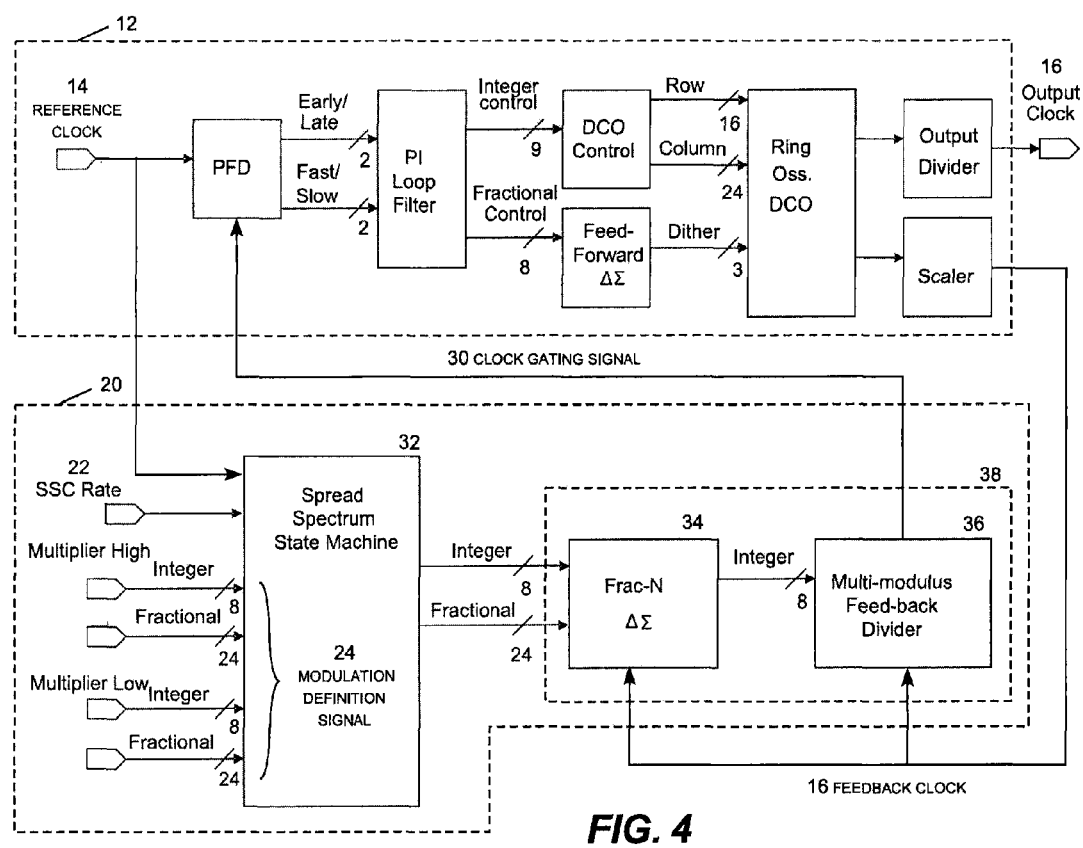
FIG. 4 is a functional block diagram of the SSC generator according to an embodiment of the invention.

FIG. 4 is a more detailed functional block diagram of the SSC generator 10 according to an embodiment of the invention. The PLL 12 may be a conventional fractional-N Phase Loop Lock frequency multiplier. FIG. 4 also shows the details of a typical fractional-N PLL functional block diagram for reference, which is well known to those skilled in the electronics field. The clock spread feature of this embodiment is implemented through the single clock gating signal 30, which feeds into a phase frequency detector (PFD) of the PLL. The PFD detects the rising edges of the clock pulses of the clock gating signal to control the multiplication factor of the PLL. Variation of the clock gating signal 30 to exhibit the modulation waveform imparts the spread spectrum aspect of the output clock 16 illustrated in FIG. 3.

The SSC state machine 20 generates the clock gating signal 30 by applying a variable multiplication factor (nominally 64× in the specific numerical example) to the reference clock 14 (100 MHz for the specific numerical example), which is received as an input to the PLL 12. The feedback clock 16 produced as an output from the PLL 12 (nominally 6.4 GHz for the specific numerical example) is also supplied as an input to the SSC state machine 20. Digital programming inputs to the SSC state machine 20 include the SSC rate 22 (for the specific numerical example, this is a scalar value that causes the SSC state machine 20 to generate 64 step pulses corresponding to a 10 KHz cycle for the modulation waveform 21) and the modulation definition signal 24. The modulation definition signal, in turn, typically includes separate "multiplier high" and "multiplier low" input signals to allow downward, upward, or center clock spread.

Within the SSC state machine 20, the reference clock 14 and the SSC rate 22 are inputs to a spread spectrum state machine 32. The spread spectrum state machine 32 also receives the integer and fractional inputs for "multiplier high" and "multiplier low" components that form the modulation definition signal 24. The modulation definition signal 24 effectively defines a programmable spread percentage and step size for the output frequency. The high and low integer bits determine a bounding box setting the spread percentage (i.e., ±1% in the specific numerical example), while the fractional bits define the steps that cause and the spread spectrum state machine traverse back and forth at the desired step rate within the bounding box to generate the clock gating signal 30. Programmed logic resident in the spread spectrum state machine 32 defines the specific feedback clock sampling patterns (i.e., the clock gating patterns 30(1), 30(2), 30(3) for the individual steps) applicable to each state that the machine is configured to generate. This allows the spread spectrum state machine 32 to generate the appropriate clock gating patterns to drive the output signal 16 to generate all of the programmable frequency outputs available through the state machine.

The output of the spread spectrum state machine 32 includes integer and fractional digital definition signals, which are fed into a fractional-N delta-sigma driver 34. The delta-sigma driver converts the digital definition signals into an integer output defining the various clock pulse rates. The integer output feeds into a multi-modulus feedback driver 36, which produces the clock gating signal 30. The clock gating signal 30 is then fed back to the PFD of the PLL 12. It will be understood by those skilled in the field that the combination of the fractional-N delta-sigma driver 34 and the multi-modulus feedback driver 36 effectively forms a programmable feedback clock divider that modulates the feedback clock 16 with the modulation waveform 21 to generate the SSC clock gating signal 30.

Figure 5:
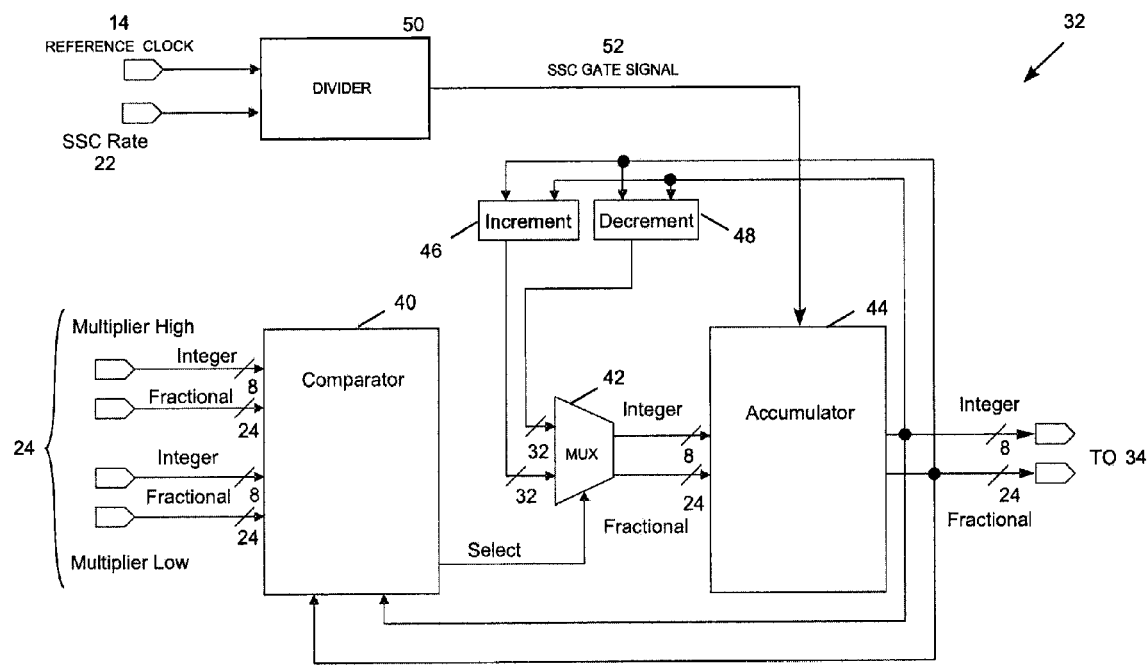
FIG. 5 is a functional block diagram of the SSC state machine of the SSC generator according to an embodiment of the invention.

FIG. 5 is a more detailed functional block diagram of the spread spectrum state machine 32. The digital modulation definition signal 24 including the "multiplier high" integer and fractional signals as well as the "multiplier low" integer and fractional signals are supplied as inputs to a comparator 40. A selected output from the comparator 40 controls a multiplexer 42, which combines input signals from an increment unit 46 corresponding to the rising portion of the output waveform with input signals from a decrement unit 48 corresponding to the declining portion of the output waveform. The output from the multiplexer, which includes an integer signal and a fractional signal defining the desired clock gating pattern, is provided to an accumulator 44. The step rate of the output waveform is controlled by a divider 50, which receives the reference clock 14 and the SSC rate 22 as inputs. The divider samples the reference clock 14 at the rate defined by the SSC rate 22 to create an SSC gate signal 52, which is provided to the accumulator 44. The SSC gate signal 52 triggers the accumulator to change states, step by step, at the rate defined by the SSC gate signal 52. Thus, the modulation definition signal 24 defines the frequency steps and the overall spread of the modulation waveform (i.e., ±64 MHz over 64 steps in the specific numerical example shown in FIG. 3), while the SSC rate 22 defines the duration of the steps and the overall frequency of the modulation waveform (i.e., 100 KHz in the specific numerical example).

Figure 6:
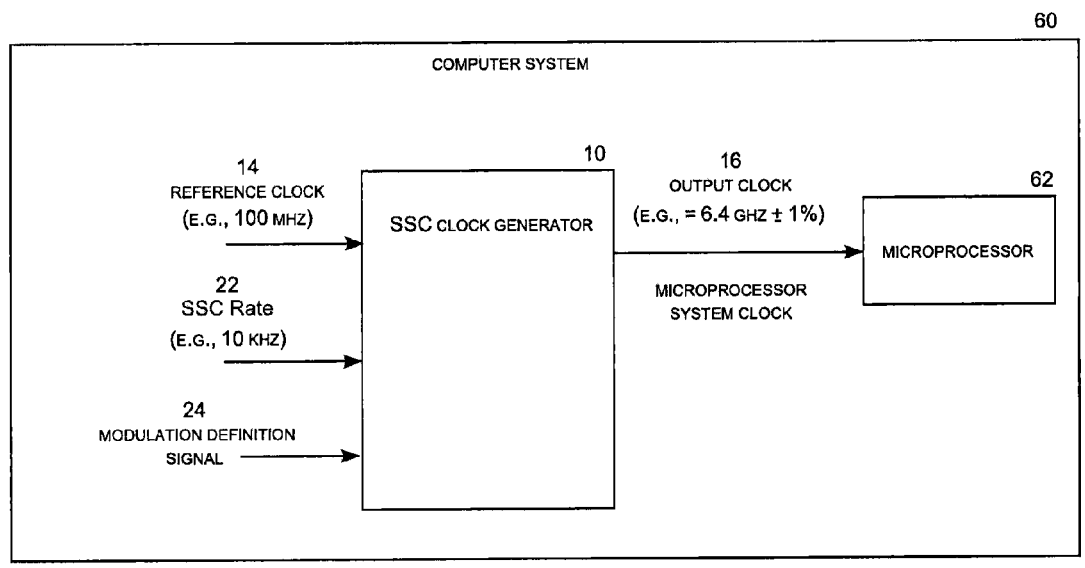
FIG. 6 is a functional block diagram of a computer system utilizing the SSC generator to provide a microprocessor system clock.

The SSC generator 10 provides a general purpose high frequency clock that may be used for virtually any application requiring a high frequency clock. To provide one example, FIG. 6 is a functional block diagram of a computer system 60 utilizing the SSC generator 10 to provide a system clock for a microprocessor of the computer system. Continuing with the numerical example, the SSC generator 10 only requires the relatively low base frequency reference clock (e.g., 100 MHz) and digital programming including the SSC rate 22 and the modulation definition signal 24, to produce the fractional-N, spread spectrum output clock 16 (i.e., ±64 MHz). Of course, many other applications that can benefit from a high frequency spread spectrum clock will become apparent to those skilled in the art once they have understood the techniques and functionality of the illustrative embodiments of the invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein illustrate just one example. There may be many variations to these diagrams or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A fractional-N spread spectrum clock (SSC) generator for a computer system, comprising:
  a fractional-N phase locked loop frequency multiplier (PLL) configured to receive a reference clock signal as an input and applying a variable multiplication factor to the reference clock signal to produce an output clock signal having a variable output frequency; and
  a spread spectrum clock (SSC) state machine configured to produce a single clock gating signal fed into the PLL for controlling the multiplication factor of the PLL to vary the output clock signal of the PLL;
  wherein the multiplication factor is set to a nominal value N and the single clock gating signal defines a modulation waveform that drives the variable multiplication factor to cause the PLL the generate a fractional-N spread spectrum output clock signal defined by digital programming input to the SSC state machine; and wherein the digital programming input to the SSC state machine comprises a modulation definition signal and an SSC rate signal.

2. The SSC generator of claim 1, wherein the modulation definition signal and the SSC rate signal define a stair-step modulation waveform.

3. The SSC generator of claim 2, wherein the clock gating signal comprises a plurality of clock pulse patterns wherein each clock pulse pattern corresponds to a step of the stair-step modulation waveform.

4. The SSC generator of claim 1, wherein the modulation definition signal further comprises a multiplier high signal controlling the modulation waveform above a nominal output clock frequency and a multiplier low signal controlling the modulation waveform below a nominal output clock frequency allowing the output clock signal to selectively reflect upper, center and down frequency spread clocks with respect to the nominal output clock frequency.

5. The SSC generator of claim 1, wherein the modulation definition signal establishes a shape of cycles of the modulation waveform and the SSC rate signal establishes a frequency of the cycles.

6. The SSC generator of claim 1, wherein the SSC state machine generates the clock gating signal utilizing inputs including the reference clock, a feedback clock, and the digital programming input without additional clock signals operating at or about clock rates for the reference clock or the feedback clock.

7. The SSC generator of claim 1, wherein the SSC state machine controls the PLL with the clock gating signal without supplying the PLL with additional feedback or clock signals.

8. A computer system comprising a microprocessor and a fractional-N spread spectrum clock (SSC) generator providing a system clock for the microprocessor, wherein the SSC comprises:
 a fractional-N phase locked frequency multiplier (PLL) configured to receive a reference clock signal as an input and applying a variable multiplication factor to the reference clock signal to produce an output clock signal having a variable output frequency;
 a spread spectrum clock (SSC) state machine configured to produce a single clock gating signal fed into the PLL for controlling the multiplication factor of the PLL to vary the output clock signal of the PLL; and
 wherein the multiplication factor is set to a nominal value N and the single clock gating signal defines a modulation waveform that drives the variable multiplication factor to cause the PLL the generate a fractional-N spread spectrum output clock signal defined by digital programming input to the SSC state machine; and
 wherein the digital programming input to the SSC state machine comprises a modulation definition signal and an SSC rate signal.

9. The computer system of claim 8, wherein the modulation definition signal and the SSC rate signal define a stair-step modulation waveform.

10. The computer system of claim 9, wherein the clock gating signal comprises a plurality of clock pulse patterns wherein each clock pulse pattern corresponds to a step of the stair-step modulation waveform.

11. The computer system of claim 8, wherein the modulation definition signal further comprises a multiplier high signal controlling the modulation waveform above a nominal output clock frequency and a multiplier low signal controlling the modulation waveform below a nominal output clock frequency allowing the output clock signal to selectively reflect upper, center and down frequency spread clocks with respect to the nominal output clock frequency.

12. The computer system of claim 8, wherein the modulation definition signal establishes a shape of cycles of the modulation waveform and the SSC rate signal establishes a frequency of the cycles.

13. The computer system of claim 8, wherein the SSC state machine generates the clock gating signal utilizing inputs including the reference clock, a feedback clock, and the digital programming input without additional clock signals operating at or about clock rates for the reference clock or the feedback clock.

14. The computer system of claim 8, wherein the SSC state machine controls the PLL with the clock gating signal without supplying the PLL with additional feedback or clock signals.

15. A method for generating a fractional-N spread spectrum clock (SSC) for a computer system, comprising:
 providing a fractional-N phase locked loop frequency multiplier (PLL) for receiving a reference clock signal as an input and applying a variable multiplication factor to the reference clock signal to produce an output clock signal having a variable output frequency;
 providing a spread spectrum clock (SSC) state machine for producing a single clock gating signal fed into the PLL for controlling the multiplication factor of the PLL to vary the output clock signal of the PLL;
 setting the multiplication factor to a nominal value N;
 providing digital programming input to the SSC state machine including a modulation definition signal and an SSC rate signal;
 wherein the single clock gating signal to defines a modulation waveform that drives the variable multiplication factor to cause the PLL the generate a fractional-N spread spectrum output clock signal defined by the digital programming input to the SSC state machine.

16. The method of claim 15, wherein the modulation definition signal and the SSC rate signal define a stair-step modulation waveform.

17. The method of claim 16, wherein the clock gating signal comprises a plurality of clock pulse patterns wherein each clock pulse pattern corresponds to a step of the stair-step modulation waveform.

18. The method of claim 15, wherein the modulation definition signal further comprises a multiplier high signal controlling the modulation waveform above a nominal output clock frequency and a multiplier low signal controlling the modulation waveform below a nominal output clock frequency allowing the output clock signal to selectively reflect upper, center and down frequency spread clocks with respect to the nominal output clock frequency.

19. The method of claim 15, wherein the SSC state machine generates the clock gating signal utilizing inputs including the reference clock, a feedback clock, and the digital programming input without additional clock signals operating at or about clock rates for the reference clock or the feedback clock.

20. The method of claim 15, wherein the SSC state machine controls the PLL with the clock gating signal without supplying the PLL with additional feedback or clock signals.

* * * * *